US008069910B2

(12) United States Patent
Beltran et al.

(10) Patent No.: US 8,069,910 B2
(45) Date of Patent: Dec. 6, 2011

(54) ACOUSTIC RESONATOR FOR SYNTHETIC JET GENERATION FOR THERMAL MANAGEMENT

(75) Inventors: Carlos Beltran, Haverhill, MA (US); Raghavendran Mahalingam, Decatur, GA (US); Samuel Heffington, Austin, TX (US); Ari Glezer, Atlanta, GA (US)

(73) Assignee: Nuventix, Inc., Austin, TX (US)

( * ) Notice: Subject to any disclaimer, the term of this patent is extended or adjusted under 35 U.S.C. 154(b) by 1326 days.

(21) Appl. No.: 11/248,542

(22) Filed: Oct. 12, 2005

(65) Prior Publication Data

US 2007/0081027 A1 Apr. 12, 2007

(51) Int. Cl.
*F28D 15/00* (2006.01)
*H05K 7/20* (2006.01)

(52) U.S. Cl. .................................. 165/121; 165/104.34

(58) Field of Classification Search ................. 165/80.3, 165/104.33, 908, 121, 122, 123, 104.34, 165/109.1; 361/695; 181/145, 148, 153, 181/199, 206; 239/102.1
See application file for complete search history.

(56) References Cited

U.S. PATENT DOCUMENTS

| | | | | |
|---|---|---|---|---|
| 5,077,601 | A * | 12/1991 | Hatada et al. | 257/722 |
| 5,161,126 | A * | 11/1992 | Marcus | 367/99 |
| 5,199,856 | A * | 4/1993 | Epstein et al. | 417/312 |
| 6,186,748 | B1 | 2/2001 | Umeda et al. | |
| 6,937,472 | B2 * | 8/2005 | Pokhama | 361/700 |
| 2003/0152239 | A1 * | 8/2003 | Graefenstein | 381/71.5 |
| 2004/0095721 | A1 * | 5/2004 | Ellsworth et al. | 361/694 |
| 2005/0121171 | A1 * | 6/2005 | Mukasa et al. | 165/80.3 |

FOREIGN PATENT DOCUMENTS

JP 02213200 A * 8/1990

OTHER PUBLICATIONS

Kashani, R.; “Fluidic Vibration Controllers”; www.deicon.com; 4 pages; Apr. 24, 2007.
Selamet, A. and Lee, I.; “Helmholtz resonator with extended neck”; J. Acoust. Soc. Am. Apr. 2003; 113(4 Pt 1):1975-85; 2 pages.
Horowitz, S. et al.; “Characterization of Compliant-Backplate Helmholtz Resonators for an Electromechanical Acoustic Liner”; University of Florida; 40th Aerospace Sciences Meeting & Exhibit; Jan. 14-17, 2002; Reno, Nevada; 10 pages.

* cited by examiner

*Primary Examiner* — Tho V Duong
(74) *Attorney, Agent, or Firm* — John A. Fortkort; Fortkort & Houston P.C.

(57) ABSTRACT

A thermal management system is provided herein which comprises a synthetic jet ejector (201) driven by an acoustic resonator (209).

25 Claims, 10 Drawing Sheets

- Prior Art -

ACOUSTIC RESONATOR FOR SYNTHETIC JET GENERATION FOR THERMAL MANAGEMENT

FIELD OF THE DISCLOSURE

The present disclosure relates generally to synthetic jet ejectors, and more specifically to the use, in thermal management applications, of acoustical resonators in conjunction with synthetic jet ejectors.

BACKGROUND OF THE DISCLOSURE

As the size of semiconductor devices has continued to shrink and circuit densities have increased accordingly, thermal management of these devices has become more challenging. This problem is expected to worsen in the foreseeable future. Thus, within the next decade, spatially averaged heat fluxes in microprocessor devices are projected to increase by a factor of two, to well over 100 W/cm$^2$, with core regions of these devices experiencing local heat fluxes that are several times higher.

In the past, thermal management in semiconductor devices was often addressed through the use of forced convective air cooling, either alone or in conjunction with various heat sink devices, and was accomplished through the use of fans. However, fan-based cooling systems were found to be undesirable due to the electromagnetic interference and noise attendant to their use. Moreover, the use of fans also requires relatively large moving parts, and corresponding high power inputs, in order to achieve the desired level of heat transfer.

More recently, thermal management systems have been developed which utilize synthetic jet ejectors. These systems are more energy efficient than comparable fan-based systems, and also offer reduced levels of noise and electromagnetic interference. Systems of this type, an example of which is depicted in FIG. 1, are described in greater detail in U.S. Pat. No. 6,588,497 (Glezer et al.).

The system depicted in FIG. 1 utilizes an air-cooled heat transfer module 101 which is based on a ducted heat ejector (DHE) concept. The module utilizes a thermally conductive, high aspect ratio duct 103 that is thermally coupled to one or more IC packages 105. Heat is removed from the IC packages 105 by thermal conduction into the duct shell 107, where it is subsequently transferred to the air moving through the duct. The air flow within the duct 103 is induced through internal forced convection by a pair of low form factor synthetic jet ejectors 109 which are integrated into the duct shell 107. In addition to inducing air flow, the turbulent jet produced by the synthetic jet ejector 109 enables highly efficient convective heat transfer and heat transport at low volume flow rates through small scale motions near the heated surfaces, while also inducing vigorous mixing of the core flow within the duct.

While the systems disclosed in Glezer et al. represent a very notable improvement in the art of thermal management systems, in light of the aforementioned challenges in the art, a need exists for thermal management systems with even greater energy efficiencies. There is also a need in the art for thermal management systems that are scalable and compact, and that do not contribute significantly to the overall size of the device. These and other needs are met by the devices and methodologies described herein.

SUMMARY OF THE DISCLOSURE

In one aspect, a thermal management system is provided herein which comprises a synthetic jet ejector which is used in combination with an acoustic resonator.

In another aspect, a synthetic jet ejector is provided in combination with an acoustic resonator which is adapted to drive the synthetic jet ejector. The combination comprises (a) a cavity, (b) a partition which divides the cavity into first and second compartments, (c) a diaphragm which extends into the first and second compartments, (d) a transducer which is adapted to vibrate the diaphragm at the resonant frequency of the cavity, and (e) first and second pipes which are in open communication with the first and second compartments, respectively.

In yet another aspect, a method for dissipating heat from a heat generating device is provided. In accordance with the method, a heat generating device is provided which is disposed in a fluid medium. An acoustic resonator is also provided which is adapted to generate a turbulent jet in the fluid medium, and which is positioned such that the turbulent jet will impinge upon the heat generating device. The acoustic resonator is then excited by a suitable transducer.

These and other aspects of the present disclosure are described in greater detail below.

DETAILED DESCRIPTION

It has now been found that the aforementioned needs can be addressed through the use, in a thermal management system, of an acoustic resonator in conjunction with one or more synthetic jet ejectors. Thermal management systems which utilize this combination exhibit significantly enhanced rates of thermal transfer at substantially lower levels of power consumption. Without wishing to be bound by theory, it is believed that the acoustic resonator acts in these systems as an efficient transformer which enables the synthetic jet ejector to operate at higher pressures and with lower movements of ambient fluid mass into and out of the synthetic jet ejector. Consequently, the synthetic jet ejector provides superior heat dissipation and better energy efficiencies. These systems are also scalable and compact, and do not contribute significantly to the overall size of a device which incorporates them. As an additional benefit, a variety of heat sinks can be formed in the thermal management systems described herein by incorporating heat exchangers, or elements thereof, into the acoustic resonator.

Figure 1:
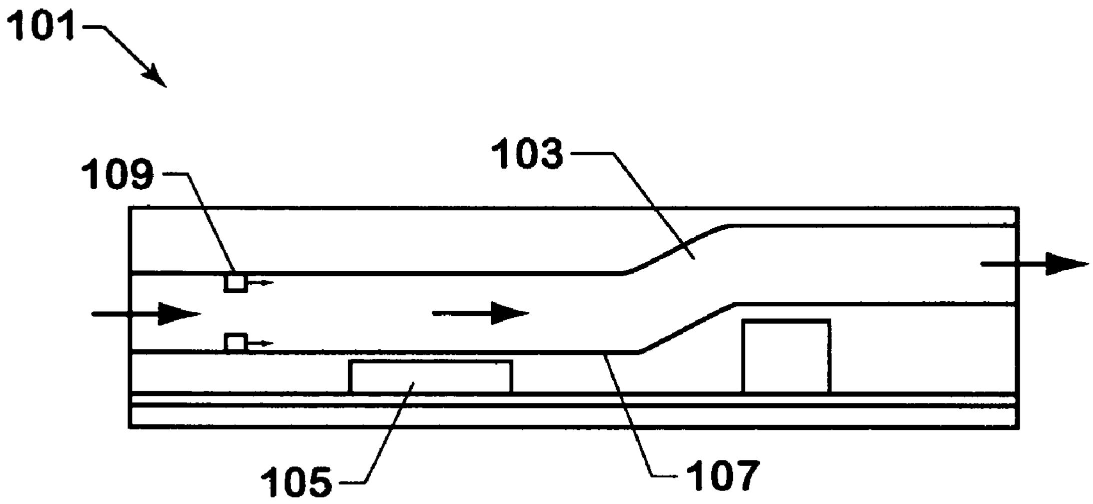
FIG. 1 is an illustration of a prior art thermal management system based on the use of synthetic jet ejectors.
Figure 2:
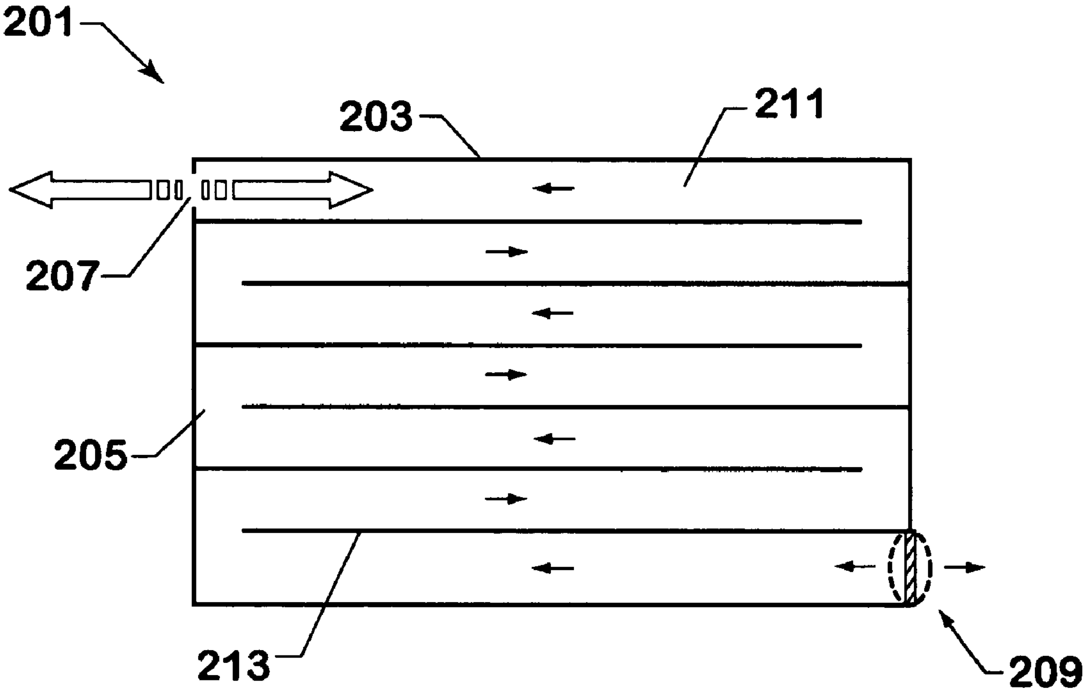
FIG. 2 is an illustration of a synthetic jet ejector made in accordance with the teachings herein.

FIG. 2 illustrates a first particular, non-limiting embodiment of a synthetic jet ejector made in accordance with the teachings herein. The synthetic jet ejector 201 depicted therein comprises a housing 203 which encloses a cavity 205. The cavity 205, which is in open communication with the ambient environment by way of an orifice 207, is equipped with an actuator 209. The actuator comprises a diaphragm which is vibrated by a transducer or by other suitable means. In the particular embodiment depicted, the cavity 205 is divided into a plurality of channels 211 through a series of partitions 213 such that an open, though convoluted, pathway is formed between the actuator 209 and the orifice 207.

The diaphragm associated with the actuator 209 is adapted to vibrate at the resonance frequency of the cavity 205. The resulting oscillations cause a portion of the mass of fluid disposed within the cavity 205 (or adjacent to the orifice 207) to be alternately expelled from, and withdrawn into, the cavity 205 via the orifice 207. These oscillations produce adiabatic rarefactions and compressions of the ambient fluid mass within the cavity 205, which generate an alternating pressure wave at the orifice 207 as indicated by the arrow. If the orifice 207 and the pathway within the cavity 205 have appropriate dimensions, the fluidic motion created by the pressure wave will induce the formation of a turbulent jet in the ambient fluid. This jet may be effectively utilized as a thermal management element by directing it at a heat source, where it serves to dissipate, in a highly efficient manner, any unwanted thermal energy generated by the heat source.

The synthetic jet ejector 201 depicted in FIG. 2 has a number of advantages over other synthetic jet ejectors as a result of the actuator 209 which drives it. Significantly, and in contrast with conventional synthetic jet ejectors, the synthetic jet ejector 201 of FIG. 2 displaces only a small portion of the fluid resident within the cavity 205. In particular, when the vibrations of the diaphragm associated with the actuator are properly tuned to the resonance frequency of the cavity 205 so that the cavity 205 functions as an acoustic resonator, an acoustical pressure wave is generated in the ambient fluid that induces fluid motion at the orifice 207 in the form of a turbulent synthetic jet. Since the synthetic jet ejector 201 of FIG. 2 requires relatively small levels of fluid displacement from the actuator in comparison to conventional synthetic jet actuators, its input power requirements are correspondingly smaller. Partially as a result of this, synthetic jet ejectors of this type offer increased reliability and lifetimes. At the same time, synthetic jet ejectors of the type depicted in FIG. 2 offer many of the same benefits as conventional synthetic jet ejectors, including a 10-fold increase in flow rate in the ambient fluid (when the ambient fluid is air) and a 2.5 fold increase in heat transfer.

Another unique attribute of the synthetic jet ejector 201 depicted in FIG. 2 is that the pressure wave is only generated (and hence the synthetic jet is only produced) when the resonance of the transducer is tuned to the resonance of the cavity 205. This feature may be used advantageously as a control mechanism for the synthetic jet ejector 201.

The principles by which the synthetic jet ejectors (and in particular, their component acoustical resonators) described herein operate, and the advantages of these devices over conventional synthetic jet ejectors and resonators, may be further understood with respect to FIGS. 3-14.

Figure 3:
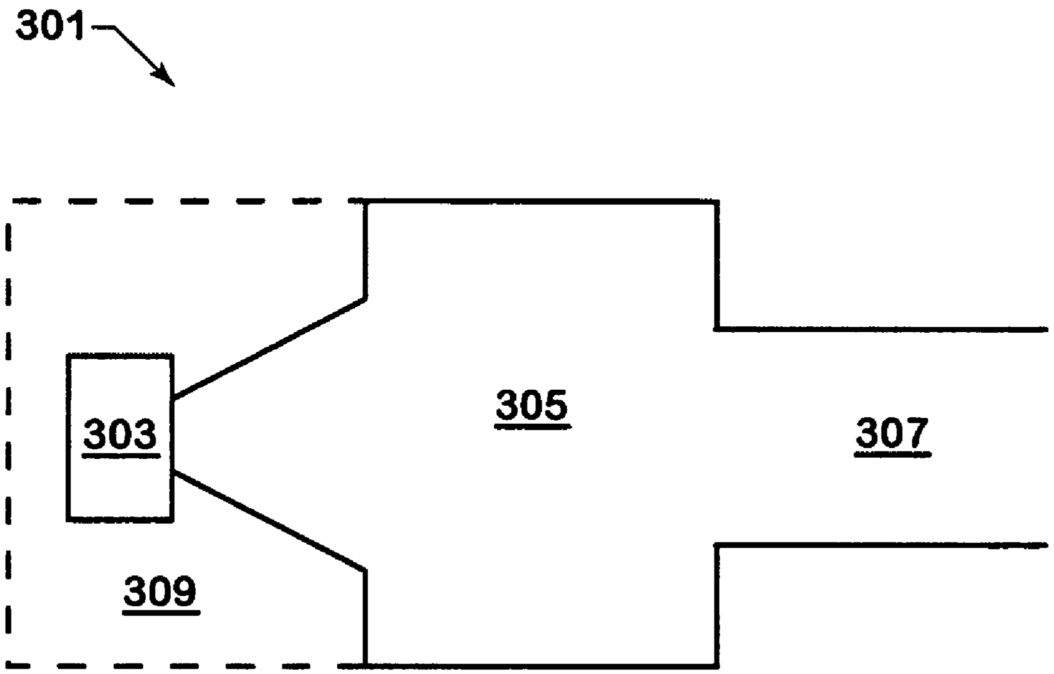
FIG. 3 is an illustration of a conventional Helmholtz resonator driven by a diaphragm.
Figure 18:
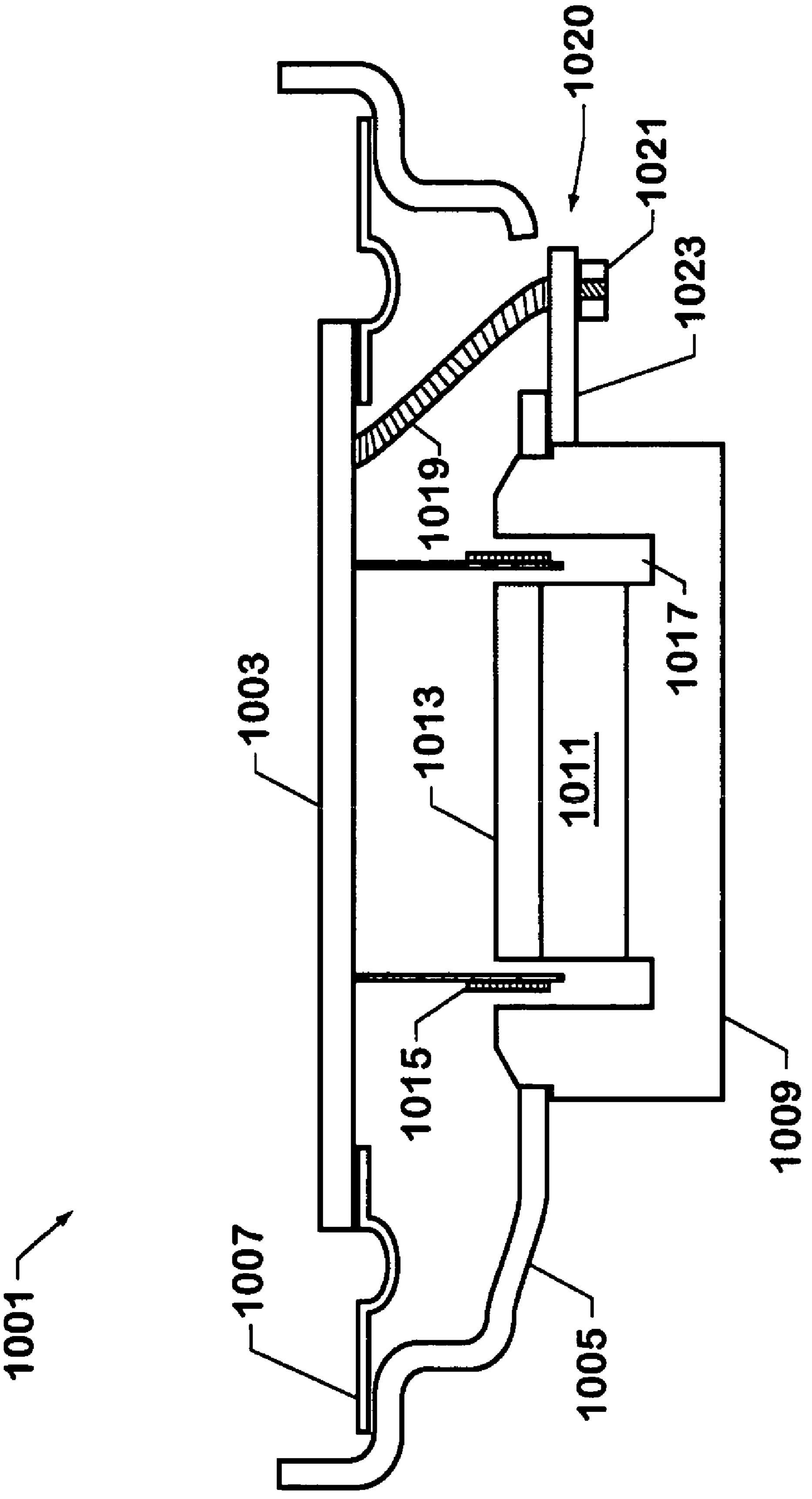
FIG. 18 is an illustration of an actuator which may be used in the systems described herein.

FIG. 3 depicts a Helmholtz resonator 301 which may be used in the thermal management devices described herein. The Helmholtz resonator 301 is driven by an actuator 303. The actuator (an example of which is shown in FIG. 18) comprises a diaphragm which is caused to vibrate at a desired frequency by an electromagnetic coil. The actuator 303 is disposed at one end of a cavity 305 that terminates in a pipe 307. An optional enclosure 309 may be provided at the rear of the actuator 303, as indicated by the dashed lines. The Helmholtz resonator 301 transforms smaller volume velocities (movements) and higher pressures at the actuator 303 (and more specifically, at the diaphragm of the actuator 303) to higher velocities and lower pressures at the external opening of the pipe 307. The velocity at the opening of the pipe 307 will be more or less the same as the velocity throughout the length of the pipe 307. Notably, there is very little movement of the ambient fluid within the volume of the cavity 305.

Figure 4:
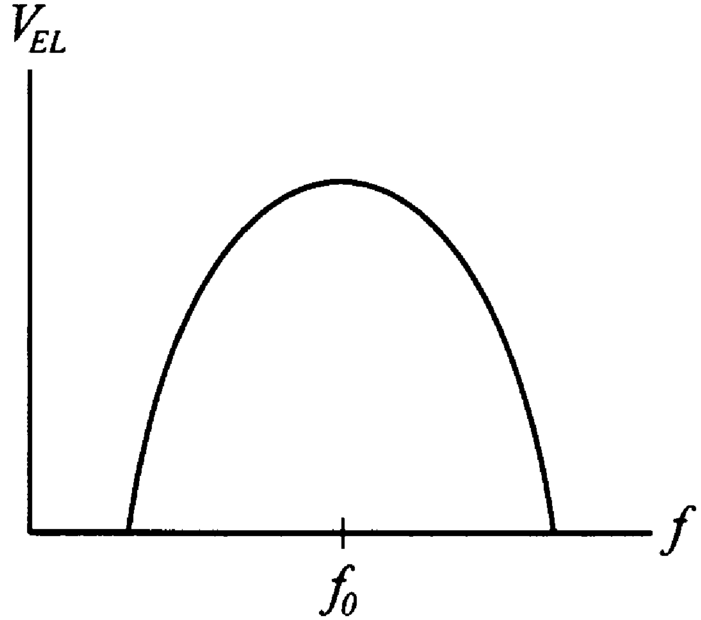
FIG. 4 is a graph of the characteristic pressure (or velocity) response of the resonator of FIG. 3.

A graph of the characteristic pressure (or velocity) response of the Helmholtz resonator 301 of FIG. 3 is illustrated in FIG. 4. As shown therein, the response is symmetrical and is centered about the characteristic frequency $f_0$ of the resonator 301.

Figure 5:
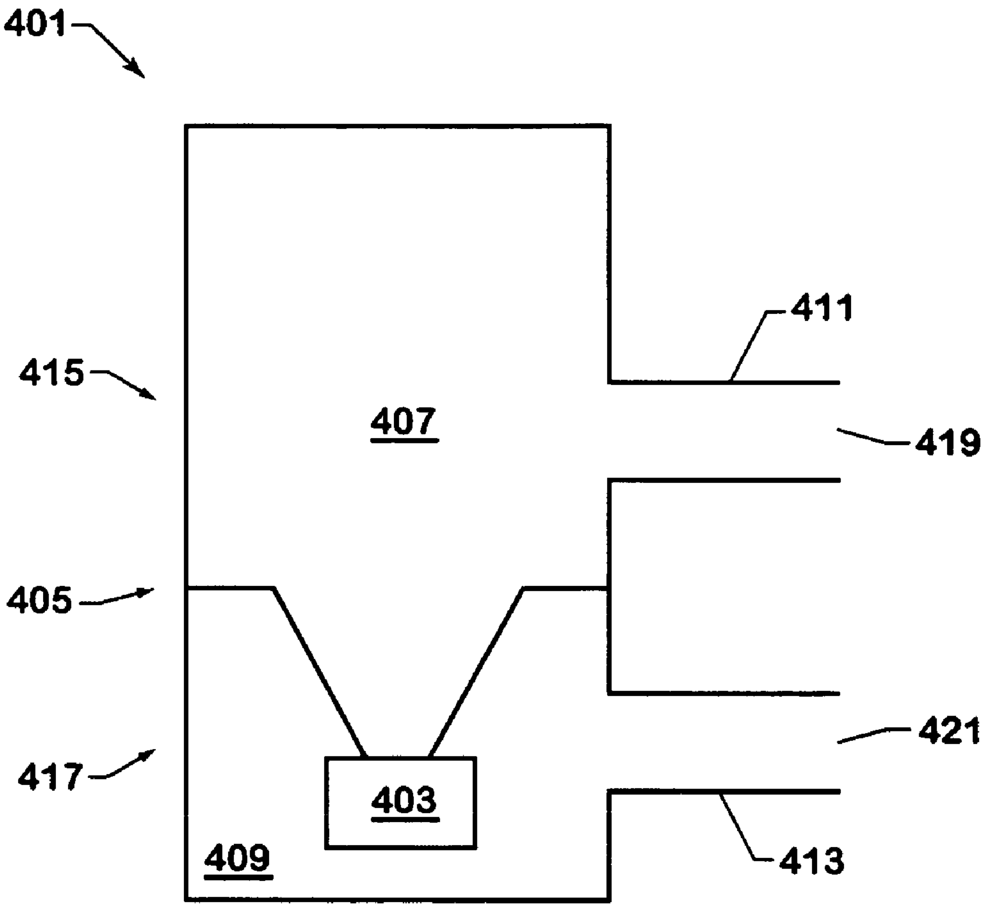
FIG. 5 is an illustration of a conventional dual Helmholtz resonator driven by a diaphragm.

FIG. 5 is an illustration of a dual Helmholtz resonator 401 which may be used in the thermal management devices described herein. The Helmholtz resonator 401 is driven by an actuator 403. The actuator 403 is disposed within a cavity 405 that is partitioned into first 407 and second 409 compartments. The first compartment 407 is equipped with a first pipe 411 terminating in a first orifice 419, and the second compartment 409 is equipped with a second pipe 413 terminating in a second orifice 421. The combination of the actuator 403, the first compartment 407, and the first pipe 411 define a first resonator 415, while the combination of the actuator 403, the second compartment 409, and the second pipe 413 define a second resonator 417.

Figure 6:
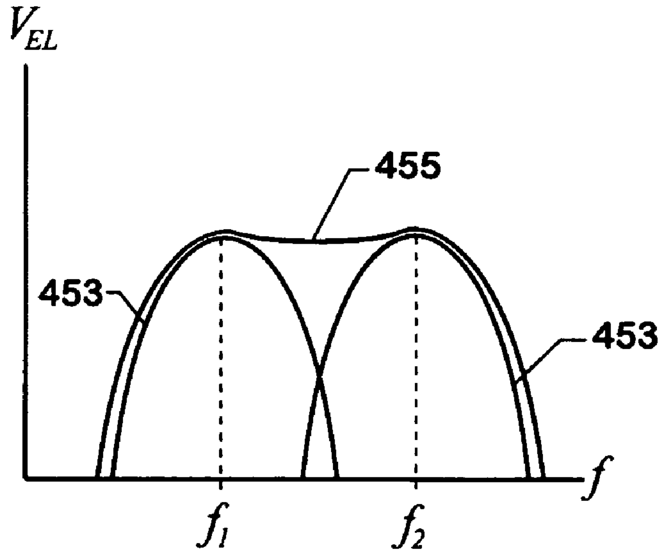
FIG. 6 is a graph of the characteristic pressure (or velocity) response of the resonator of FIG. 5.

The characteristic pressure (or velocity) response of the Helmholtz resonator 401 of FIG. 5 is illustrated in FIG. 6. As seen therein, the response 451 of the first Helmholtz resonator 415 is symmetrically centered about its characteristic frequency $f_1$, while the response 453 of the second Helmholtz resonator 417 is symmetrically centered about its characteristic frequency $f_2$. The aggregate response 455 of the dual Helmholtz resonator 401 is thus the sum of the individual responses of the first 415 and second 417 resonators. Typically, the ratio $f_2/f_1$ will be in the range of about 4:3 to about 5:2, and more typically will be approximately 2:1, to achieve a more or less uniform output over a frequency span of approximately 1.5 octaves. At these ratios, the relative phase of the two outputs from each side of the diaphragm causes them to interfere in a constructive manner, thus increasing the output of the resonator.

Figure 7:
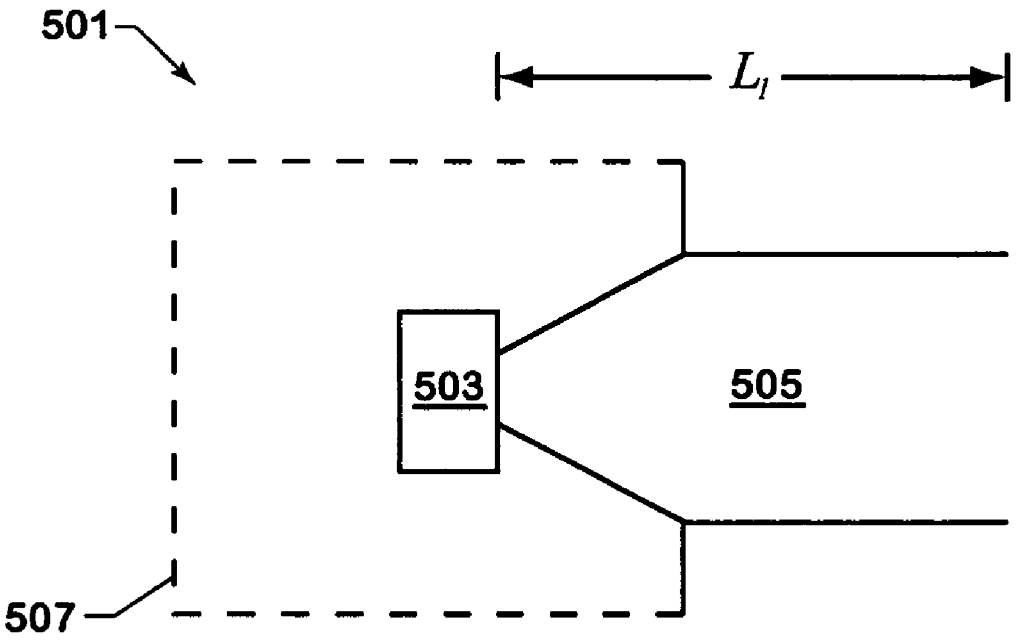
FIG. 7 is an illustration of a conventional single-sided tuned pipe.

FIG. 7 illustrates a single-sided tuned pipe resonator 501 which may be used in the thermal management devices described herein. The resonator 501 is driven by an actuator 503 which is disposed at one end of a pipe 505. The actuator may optionally be enclosed by a housing 507. As explained below, the distance $L_1$ from the actuator 503 (and more specifically, from the diaphragm thereof) to the end of the pipe 505 has a significant impact on the resonance frequency of the resonator 501.

Figure 8:
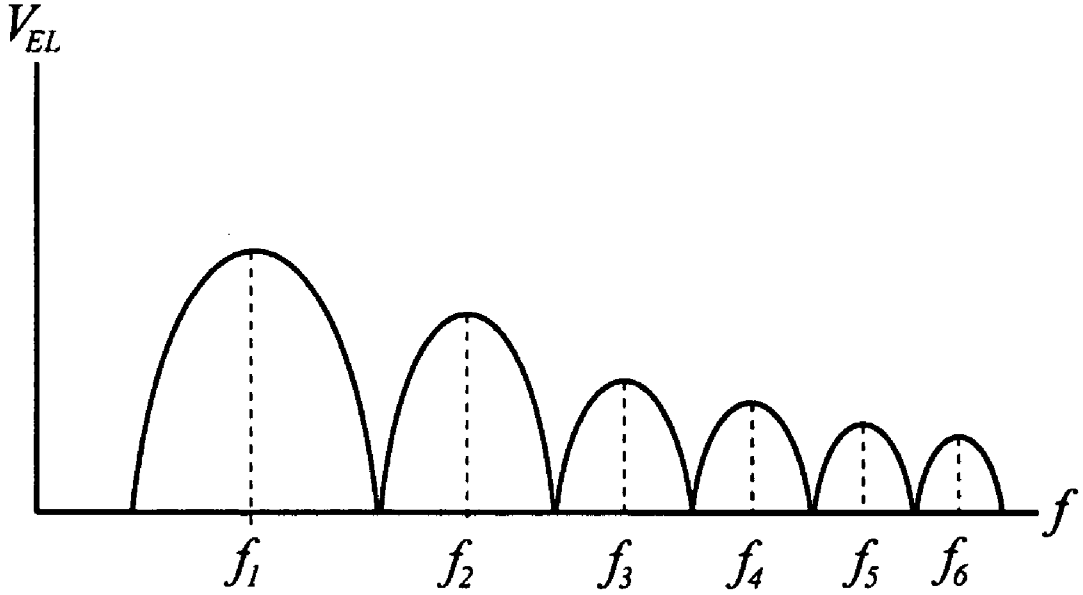
FIG. 8 is a graph of the characteristic pressure (or velocity) response of the resonator of FIG. 7.

The characteristic pressure (or velocity) response of the resonator 501 of FIG. 7 is illustrated in FIG. 8. As shown therein, the resonator 501 has a number of harmonic resonance frequencies $f_2, f_3, \ldots, f_3$, in addition to its primary resonance frequency $f_1$. The primary resonance frequency $f_1$ and the harmonic resonance frequencies $f_2, f_3, \ldots, f_n$ are determined by length $L_1$ (see FIG. 7). In particular, the relationship between the $k^{th}$ resonance frequency $f_k$ and the length $L_1$ is given by EQUATION 1 below:

$$f_k = \frac{(2k-1)c}{4L_1} \qquad \text{(EQUATION 1)}$$

where c is the speed of sound in the ambient fluid.

Figure 9:
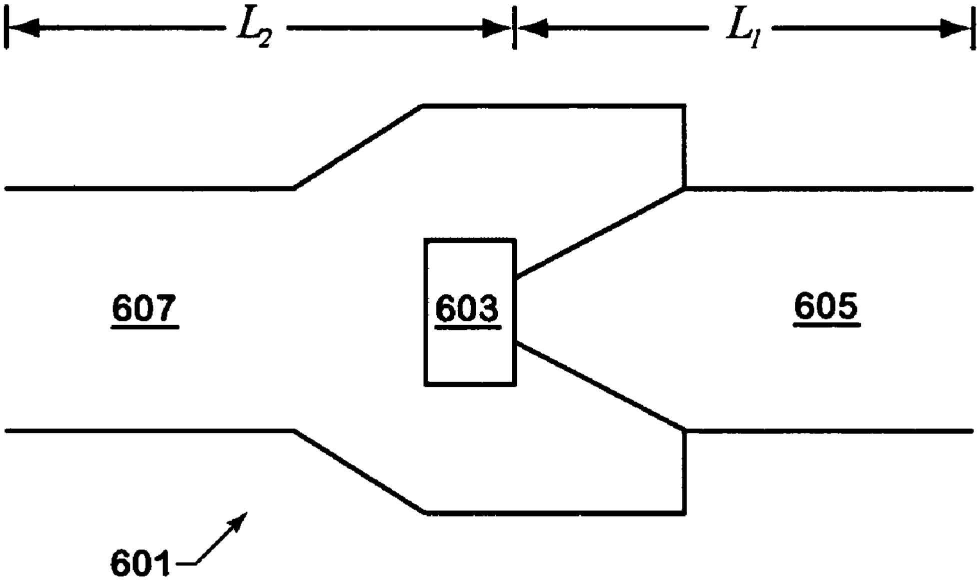
FIG. 9 is an illustration of a conventional dual tuned pipe.

FIG. 9 depicts a dual tuned pipe resonator 601 which may be used in the thermal management devices described herein. The resonator 601 is driven by an actuator 603 which is disposed at the joined ends of first 605 and second 607 pipes. The distance between the actuator (and more specifically, the diaphragm thereof) 603 and the end of the first pipe 605 is $L_1$, while the distance between the actuator (and more specifically, the diaphragm thereof) 603 and the end of the second pipe 607 is $L_2$.

Figure 10:
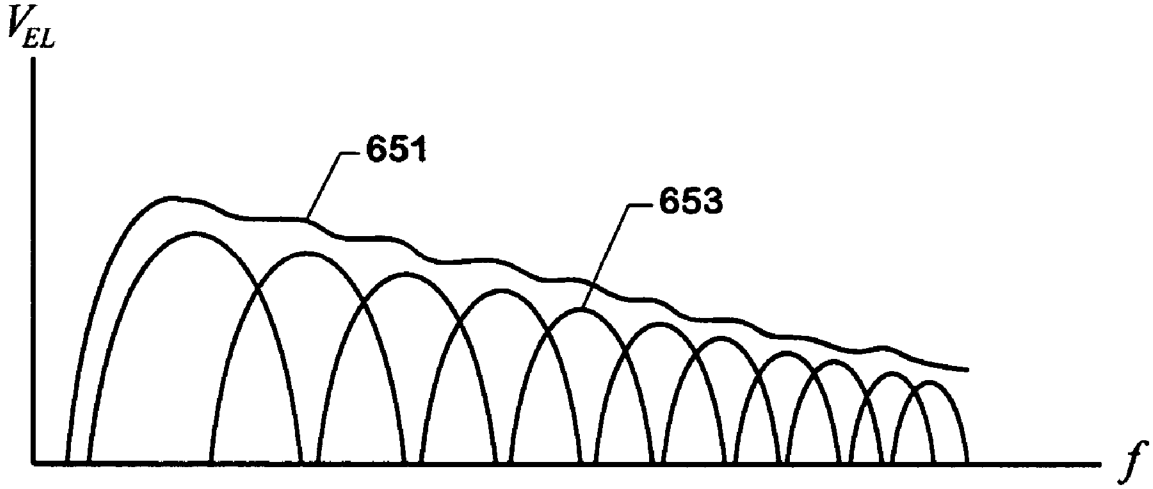
FIG. 10 is a graph of the characteristic pressure (or velocity) response of the resonator of FIG. 9.

The characteristic pressure (or velocity) response of the resonator 601 of FIG. 9 is illustrated in FIG. 10. As shown therein, the characteristic response 651 of the resonator 601 is a combination of the responses 653 of the first 605 and second 607 pipes, including their respective primary and harmonic resonances. Typically, the ratio $L_2/L_1$ of the length $L_1$ of the first pipe 605 to the length $L_2$ of the second pipe 607 will be approximately 3:1 to achieve a more or less uniform (although combined) output 653 over a frequency span of 3 octaves or more. Resonators of the type depicted in FIG. 9 are not typically used in audio applications, due to the poor transient response (time domain behavior) inherent in their design.

Figure 11:
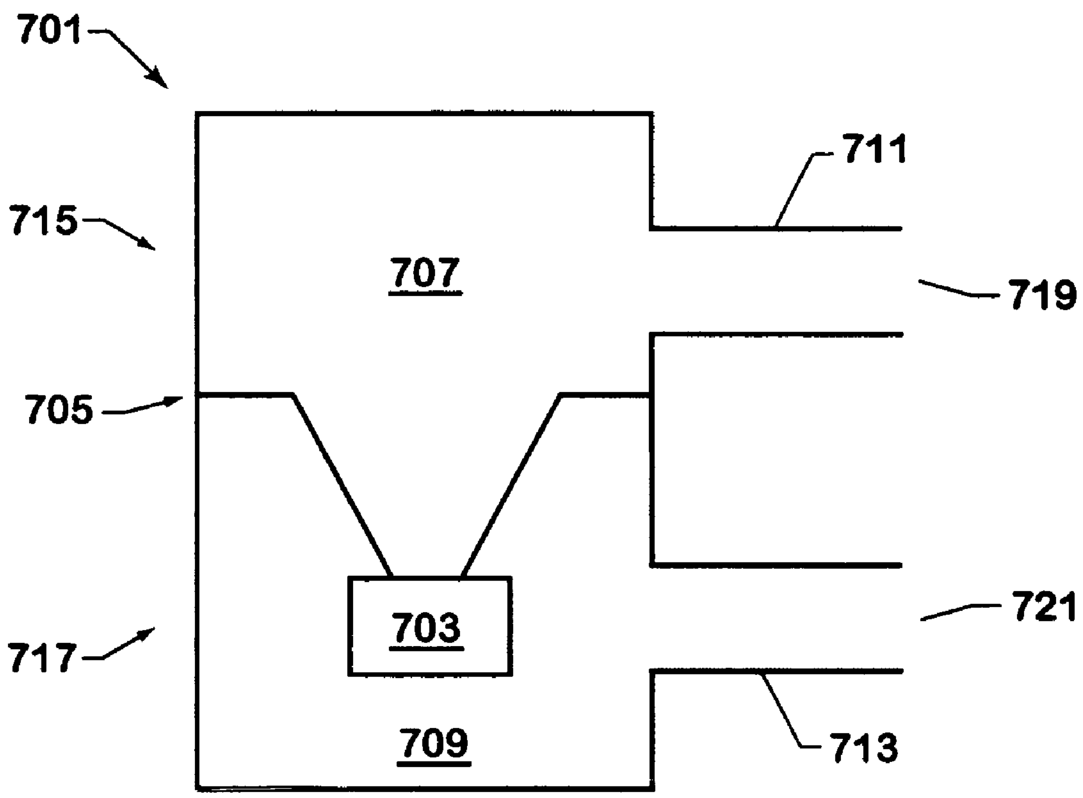
FIG. 11 is an illustration of a dual Helmholtz resonator designed for thermal management applications in accordance with the teachings herein.

FIG. 11 illustrates a first particular, non-limiting embodiment of a preferred Helmholtz resonator 701 useful in thermal management systems and devices of the type described herein. The resonator 701 is driven by an actuator 703 which is disposed within a cavity 705 that is partitioned into first 707 and second 709 compartments. The first compartment 707 is equipped with a first pipe 711 that terminates in a first orifice 719, and the second compartment 709 is equipped with a second pipe 713 that terminates in a second orifice 721. The combination of the actuator 703, the first compartment 707, and the first pipe 711 define a first resonator 715, while the combination of the actuator 703, the second compartment 709, and the second pipe 713 define a second resonator 717.

In contrast to the Helmholtz resonator 401 depicted in FIG. 5, in the Helmholtz resonator 701 of FIG. 11, the tuning is identical on each side of the diaphragm 703 (that is, the tuning of the first 715 and second 717 resonators is the same). This may be accomplished, in part, by ensuring that the volume of the first 707 and second 709 compartments is the same. When the first 715 and second 717 resonators are tuned in this manner, their output will be essentially identical but will be 180° out of phase, and hence the outputs of the first 715 and second 717 resonators will effectively cancel each other out. Preferably, the orifices 719 and 721 in pipes 711 and 713 will be small relative to the wavelengths of the primary resonances of the first 707 and second 709 compartments, respectively. It is also preferred that the spacing between the orifices 719 and 721 should be as close together as possible. Preferably, the primary resonances of the first and second compartments occur at the same wavelength λ, and both the orifice diameters and the distance between the orifices are on the order of about ⅕λ or less.

Figure 12:
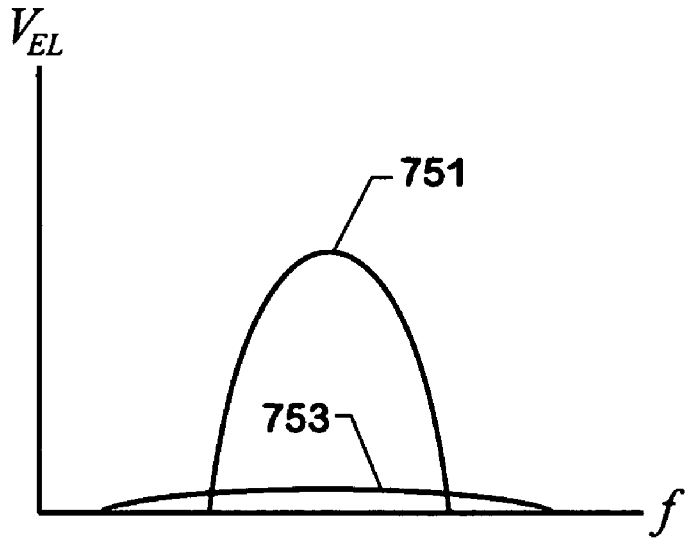
FIG. 12 is a graph of the characteristic pressure (or velocity) response of the resonator of FIG. 11.

FIG. 12 depicts the characteristic response of the Helmholtz resonator 701 of FIG. 11. The outputs 751 of the individual resonators 715, 717 are essentially the same, but are out of phase by 180°. Consequently, the combined output (summed over all space) 753 of the Helmholtz resonator is very low (a small fraction of the output of either side), and follows the characteristics of a dipole radiator whose dimensions are small relative to the wavelength being emitted.

Figure 13:
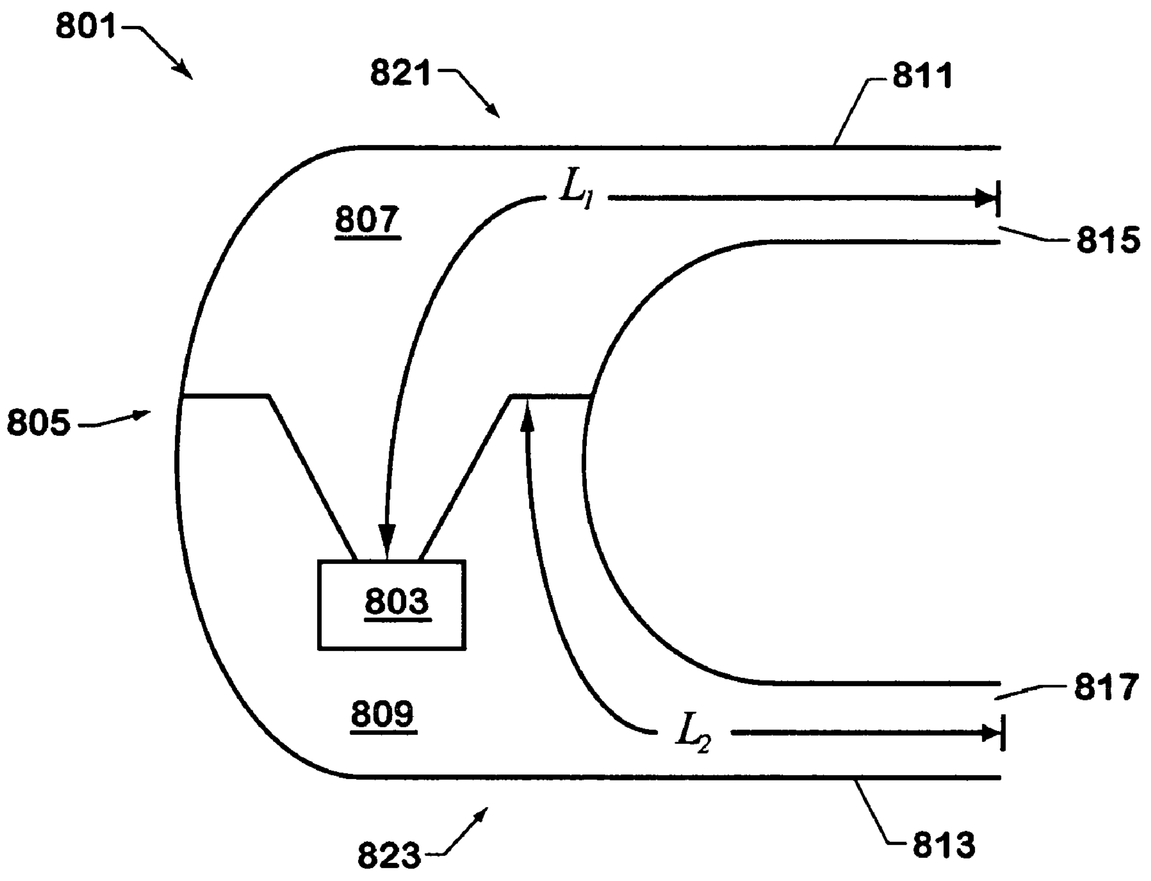
FIG. 13 is an illustration of a dual pipe resonator designed for thermal management applications in accordance with the teachings herein.

FIG. 13 illustrates a second particular, non-limiting embodiment of a preferred pipe resonator 801 that is useful in the thermal management devices and methodologies disclosed herein. The particular embodiment depicted has a dual pipe configuration in which the resonator 801 is driven by an actuator 803 that is disposed within a cavity 805, and wherein the cavity 805 is partitioned into first 807 and second 809 compartments. The first compartment 807 is equipped with a first pipe 811 that terminates in a first orifice 815, and the second compartment 809 is equipped with a second pipe 813 that terminates in a second orifice 817. The combination of the actuator 803, the first compartment 807 (including the first pipe 811) and the first orifice 815 defines a first resonator 821, while the combination of the actuator 803, the second compartment 809 (including the second pipe 813), and the second orifice 817 defines a second resonator 823.

In contrast to the dual pipe resonator depicted in FIG. 9, in the pipe resonator 801 of FIG. 13, the tuning is identical on each side of the actuator 803 (that is, the tuning of the first 821 and second 823 resonators is the same). This may be accomplished, in part, by ensuring that the distance $L_1$ between the actuator 803 and the first orifice 815 is equal to the distance $L_2$ between the actuator 803 and the second orifice 817. When the first 821 and second 823 resonators are tuned in this manner, their output will be essentially identical but will be 180° out of phase, and hence will effectively cancel each other out. Preferably, the orifices 815 and 817 in pipes 811 and 813 will be relatively small compared to the wavelengths of the primary resonances of first 807 and second 809 compartments, respectively. It is also preferred that the spacing between the first orifice 815 and the second orifice 817 should be as close together as possible. As before, it is preferred that $L_1$ and $L_2$ are about ⅕λ or less, where λ is the wavelength corresponding to the resonance frequency of pipes 811 and 813.

Figure 14:
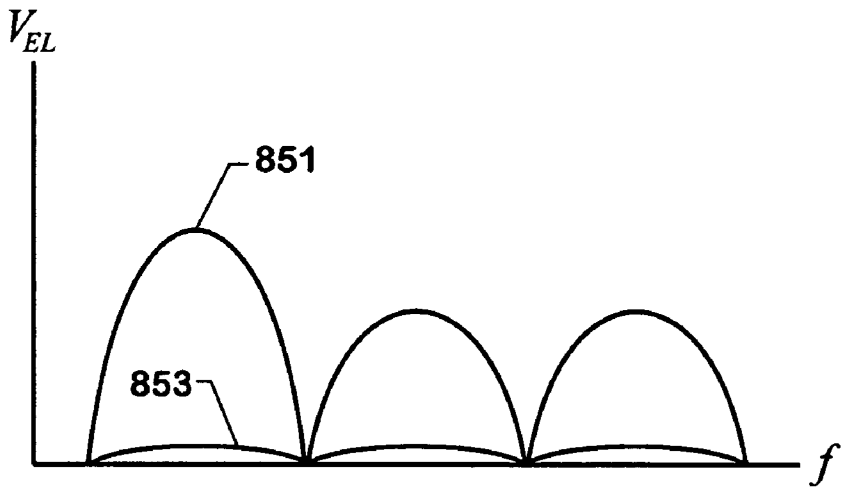
FIG. 14 is a graph of the characteristic pressure (or velocity) response of the resonator of FIG. 13.

FIG. 14 depicts the characteristic response of the dual pipe resonator 801 of FIG. 13 for the primary resonance and two harmonics thereof. The output 851 of each of the first 815 and second 817 resonators is essentially the same, but is out of phase by 180°. Consequently, the combined output 853 (summed over all space) of the resonator is very low (a small fraction of the output of either side). The design of the dual pipe resonator 801 of FIG. 13 offers low acoustic emissions by default, as the response of the device is inherently a low pass filter. This filter reduces the higher frequency sounds emitted by the actuator 803, and thus improves the sound quality of the thermal management system.

Figure 15:
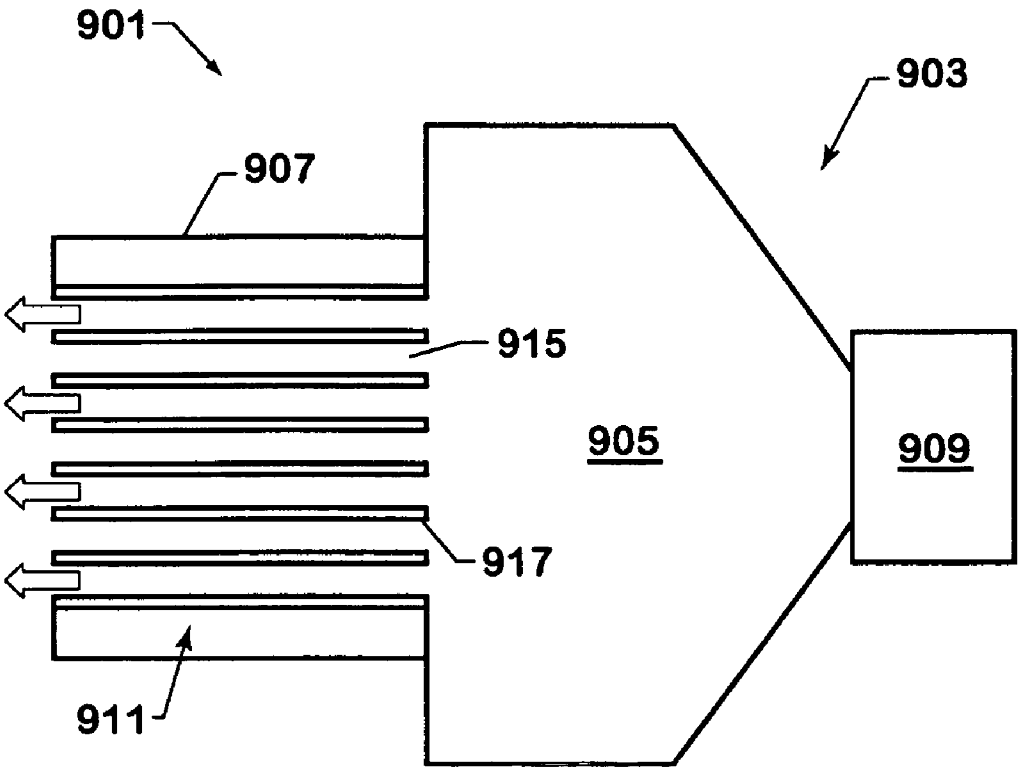
FIG. 15 is an illustration (top view) of a heat sink in accordance with the teachings herein in which the fins of a heat exchanger are incorporated into the pipe of a Helmholtz resonator.
Figure 16:
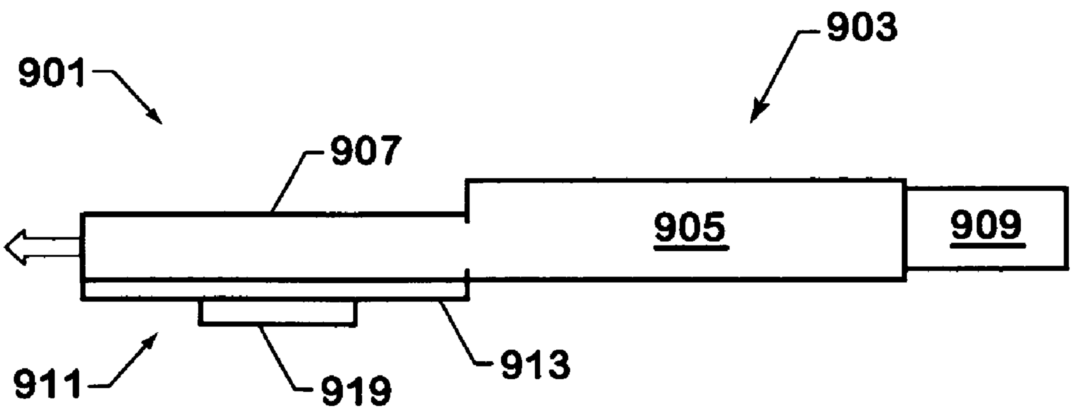
FIG. 16 is a side view of the heat sink of FIG. 15.
Figure 17:
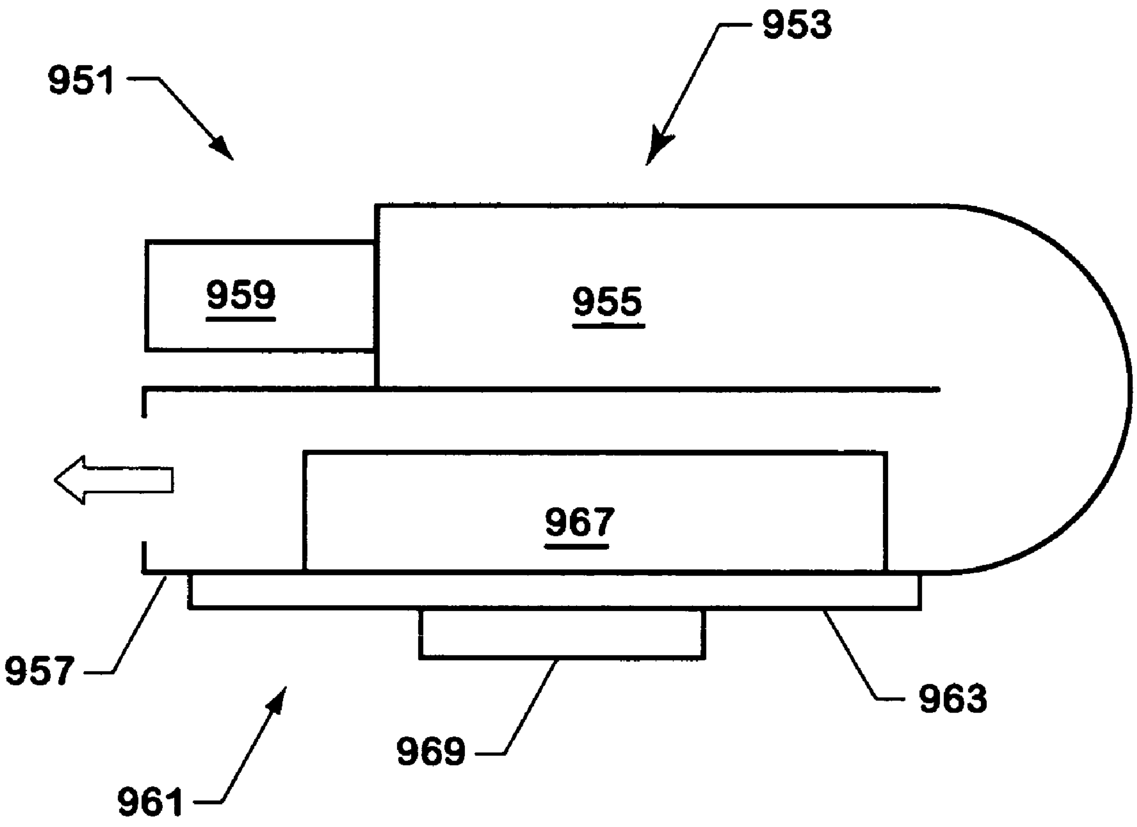
FIG. 17 is a cross-sectional illustration of a heat sink in accordance with the teachings herein in which the fins of a heat exchanger are incorporated into the pipe of a Helmholtz resonator, and in which the cavity of the resonator is stacked on top of the pipe.

FIGS. 15-17 depict two particular, non-limiting embodiments of highly efficient heat sinks made in accordance with the teachings herein which may be used for the thermal management of heat generating devices. These heat sinks feature acoustically tuned resonators of the type described herein which are coupled with heat exchangers. The heat generating devices that may be thermally managed by these heat sinks include, without limitation, die and other semiconductor devices, printed circuit boards (PCBs), processors, memory chips, graphics chips, batteries, radio-frequency components, and other devices in laptops, PDAs, mobile phones, telecom switches, and other electronic equipment.

FIGS. 15 and 16 depict a first particular, non-limiting embodiment of such a heat sink. The heat sink 901 depicted therein comprises a Helmholtz resonator 903 which includes a cavity 905 and a pipe 907. The Helmholtz resonator 903 is driven by an actuator 909 which vibrates a diaphragm. Although the Helmholtz resonator 903 is depicted in FIGS. 15-16 as a single pipe unit, it will be appreciated that, with appropriate modifications, similar heat sinks could be fabricated using any of the acoustic resonators described herein, including dual or multi-pipe resonators.

The pipe 907 has a heat exchanger 911 incorporated therein. The heat exchanger 911 comprises a base 913 (see FIG. 16) having a series of channels 915 defined thereon (see FIG. 15), each channel 915 being bounded by a pair of fins 917. The heat exchanger 911 preferably comprises a highly thermally conductive material, such as a metal, which is in thermal contact with a heat generating device 919 (see FIG. 16) that is to be thermally managed.

In operation, the resonator 903 generates pressure waves which induce the formation of focused turbulent jets (indicated by arrows in the figures) along the longitudinal axes of the channels 915 of the heat exchanger 911. These focused jets effectively dissipate the heat that is transferred to the heat exchanger 911 from the heat generating device 919.

FIG. 17 illustrates yet another particular, non-limiting embodiment of a heat sink made in accordance with the teachings herein. This heat sink 951 again comprises a Helmholtz resonator 953, which includes a cavity 955 with an actuator 959 disposed on one end thereof. A pipe 957 is attached to the opposing end of the cavity 955. The pipe 957 has disposed within it a heat exchanger 961 comprising a series of fins 967 that are mounted on a base plate 963. The base plate 963 is in thermal contact with a heat generating device 969 which is to be thermally managed.

The operation of the heat sink 951 of FIG. 17 is similar to the operation of the heat sink 901 depicted in FIGS. 15-16. However, in the embodiment depicted in FIG. 17, the cavity 955 is mounted on top of the pipe 957, thereby minimizing the horizontal dimensions of the heat sink 951. Such a configuration is especially useful in applications where sufficient vertical room is available, but where lateral real estate is limited.

FIG. 18 illustrates on specific, non-limiting embodiment of an actuator 1001 that may be used in the acoustic resonators described herein. This particular actuator 1001 is a speaker which includes a diaphragm 1003 mounted on a basket 1005 by a resilient suspension 1007 (also called a surround). The basket 1005 is in turn supported on a pot 1009 which houses a permanent magnet 1011. A top plate 1013, which is typically made of steel or a suitable metal, is mounted over the permanent magnet 1011. An annular voice coil 1015 is suspended from the back of the diaphragm 1003 and within an annular groove 1017 formed between the pot 1009 and the combination of the permanent magnet 1011 and top plate 1013. The voice coil 1015 is preferably formed from a coil of copper wire which is wound around a spool. The speaker also includes a tinsel lead 1019 which is connected on one end to the diaphragm 1003, and which is connected on the opposing end to a terminal strip 1020, the later of which includes a fastener 1021 and a terminal board 1023.

In operation, when the electrical current or signal flowing through the voice coil 1015 changes direction, the polar orientation of the electromagnetic field created by the voice coil 1015 reverses, thus altering (by 180° along the longitudinal axis of the voice coil 1015) the direction of magnetic repulsion and attraction between the permanent magnet 1011 and the electromagnet of the voice coil 1015. This has the effect of moving the voice coil 1015 and the attached diaphragm 1003 back and forth along the longitudinal axis of the voice coil 1015, thus inducing physical vibrations in the diaphragm 1003. As is well understood to those skilled in the art, the speaker thus serves to translate the electrical signals input into the voice coil 1015 into physical vibrations in the diaphragm 1003, thus generating acoustical waves in the surrounding medium. As has been previously noted, when the actuator 1001 is used to generate acoustical waves of the proper wavelength or frequency, it generates an acoustical pressure wave in the ambient medium that induces fluid motion at the orifice of the acoustical resonator in the form of a turbulent synthetic jet.

The use of focused jets in the heat sinks and associated thermal management systems described herein is found to have several advantages. First of all, while pumps and fans can be utilized in such systems to provide a suitable global flow of coolant fluid (e.g., air, water, or the like) through the system, the flow rate of the fluid within the channels of a heat exchanger of the type depicted in FIGS. 15-16 is typically much slower, due to the pressure drop created by the channel walls. This problem worsens as the system becomes smaller. Indeed, such a pressure drop is one of the biggest obstacles to the miniaturization of such systems. The use of focused jets to direct a stream of fluid into the channels overcomes this problem by reducing this pressure drop, and hence facilitates increased entrainment of the flow of fluid through the channels.

The use of focused jets in the heat sinks and associated thermal management systems described herein also significantly improves the efficiency of the heat transfer process in these systems. Under conditions in which the coolant fluid is a liquid and is in a non-boiling state, the flow augmentation provided by the use of synthetic jet ejectors increases the rate of local heat transfer in the channel structure, thus resulting in higher heat removal. Under conditions in which the coolant fluid is a liquid and is in a boiling state, these jets induce the rapid ejection of vapor bubbles formed during the boiling process. This dissipates the insulating vapor layer that would otherwise form, and hence delays the onset of critical heat flux. In some applications, the synthetic jets may also be utilized to create beneficial nucleation sites to enhance the boiling process. The foregoing considerations make the devices and methodologies disclosed herein particularly suitable for pool boiling applications.

The systems and methodologies described herein further increase the efficiency of the heat transfer process by permitting this process to be augmented locally in accordance with localized thermal loads. For example, the current trend in the semiconductor industry is toward semiconductor devices that generate heat in an increasingly non-uniform manner. This results in the creation of hotspots in these devices which, in many cases, is the first point of thermal failure of the device. Through the provision of directed, localized synthetic jets, these hot spots can be effectively eliminated, thereby reducing the global power requirements of the thermal management system. The reduction in power requirement attendant to the flow augmentation provided by the synthetic jet ejectors also reduces the noise of the system, and improves the reliability of any pumps used to circulate the coolant fluid.

A number of variations are possible in the devices described above. For example, while single pipe and dual pipe acoustical resonators have been specifically described, one skilled in the art will appreciate that devices comprising more than two acoustical resonators can also be created in accordance with the teachings herein. Where noise suppression is a concern, it is preferred that the orifices in these devices are small and are spaced close together, and that the comparative geometries of the individual resonators are such that effective noise suppression can occur through destructive interference.

The synthetic jet ejectors described herein can be implemented at several volume scales and frequencies. The volume of the cavity and the area of the orifice will typically be significant parameters for tuning the actuator and cavity resonances. Typically, other things being equal, as the volume of the cavity decreases, the transducer frequency must increase in order to produce a resonance pressure wave. However, in some embodiments, it may be possible to significantly modify the acoustic performance characteristics of the synthetic jet ejector without changing the cavity dimensions. This may be achieved, for example, by lining the cavity with a fibrous material, in which case both the density and thickness of the fibrous material can affect the acoustic performance characteristics of the synthetic jet ejector. In some applications, such an approach may be utilized to permit reductions in cavity size without an associated increase in resonance frequency.

In many thermal management applications, although the volume of the cavity of the acoustic resonator is significant, the specific dimensions of the cavity are not critical, so long as the appropriate volume is realized. Consequently, the cavity can be implemented in a wide variety of shapes, and may have a plurality of passages. The flexibility in housing design afforded by this feature is a significant advantage over other thermal management devices, such as fan-based units.

In some embodiments of the devices and methodologies described herein, the synthetic jet ejector can be utilized in an on-demand mode. Thus, for example, the synthetic jet ejector may be adapted to be triggered when the device temperature reaches a pre-set limit. Operating the synthetic jet ejector in such a mode can be advantageous, in some instances, in improving the reliability of the thermal management device, while maintaining the prescribed temperature limits on the device being managed.

One skilled in the art will appreciate that the devices and methodologies described herein may be employed in applications wherein the ambient fluid medium is either a gas or a liquid. As a specific, non-limiting example of the former, these systems may be applied where ambient air is utilized as the fluid medium. Of course, it will be appreciated that other gasses could also be advantageously employed, especially if the thermal management system in question is a closed loop system. Specific, non-limiting examples of liquids that could be employed as the fluid medium include, but are not limited to, water and various organic liquids, such as, for example, polyethylene glycol, polypropylene glycol, and other polyols, partially fluorinated or perfluorinated ethers, and various dielectric materials. Liquid metals may also be advantageously used in the devices and methodologies described herein. Such materials are generally metal alloys with an amorphous atomic structure.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A thermal management system, comprising:

a synthetic jet ejector driven by an acoustical resonator having a first pipe; wherein said acoustical resonator operates at one of its resonance frequencies, wherein said acoustical resonator has a plurality of harmonic resonance frequencies $f_2, f_3, \ldots, f_n$ in addition to a primary resonance frequency $f_1$, wherein the primary resonance frequency $f_1$ and the harmonic resonance frequencies $f_2, f_3, \ldots, f_n$ are determined by the length $L_1$ of the first pipe, and wherein the relationship between the $k^{th}$ resonance frequency $f_k$ and the length $L_1$ is given by $$f_k = \frac{(2k-1)c}{4L_1}$$

where c is the speed of sound in the ambient fluid.

2. The thermal management system of claim 1, wherein said acoustical resonator is a Helmholtz resonator.

3. The thermal management system of claim 1, wherein said acoustical resonator comprises a cavity and an orifice, and wherein said cavity has a diaphragm mounted on a surface thereof.

4. The thermal management system of claim 1, wherein said acoustical resonator comprises a cavity which is partitioned into first and second compartments, and wherein each of said first and second compartments has an orifice therein.

5. The thermal management system of claim 1, wherein said acoustical resonator comprises a cavity which is partitioned into first and second compartments, and wherein each of said first and second compartments is in open communication with a pipe.

6. The thermal management system of claim 5, wherein the volume of the first compartment is essentially equal to the volume of the second compartment.

7. The thermal management system of claim 6, further comprising a diaphragm which is open to both of said first and second compartments.

8. In combination with a synthetic jet ejector, a Helmholtz resonator which drives said synthetic jet ejector at a resonance frequency of said Helmholtz resonator, said combination comprising:

a cavity;

a partition which divides said cavity into first and second compartments;

a diaphragm which extends into said first and second compartments;

a transducer adapted to vibrate the diaphragm; and first and second pipes which are in open communication with said first and second compartments, respectively;

wherein the resonator has a plurality of harmonic resonance frequencies $f_2, f_3, \ldots, f_n$ in addition to a primary resonance frequency $f_1$, wherein the primary resonance frequency $f_1$ and the harmonic resonance frequencies $f_2, f_3, \ldots, f_n$ are determined by the length $L_1$ of the first pipe, and wherein the relationship between the $k^{th}$ resonance frequency $f_k$ and the length $L_1$ is given by $$f_k = \frac{(2k-1)c}{4L_1}$$

where c is the speed of sound in the ambient fluid.

9. The combination of 8, wherein the volume of said first compartment is essentially equal to the volume of said second compartment.

10. The combination of claim 8, wherein at least one of said first and second pipes extends through a heat exchanger.

11. The combination of claim 8, wherein said transducer comprises an electromagnetic coil.

12. The combination of claim 8, wherein the ratio $L_2/L_1$ of the length $L_1$ of the first pipe to the length $L_2$ of the second pipe is approximately 3:1.

13. The combination of claim 12, wherein the Helmholtz resonator provides an essentially uniform output over a frequency span of at least 3 octaves.

14. The combination of 8, wherein the volume of said first compartment is different from the volume of said second compartment.

15. The combination of claim 8, wherein the primary resonances of the first and second compartments occur at essentially the same wavelength λ, and wherein the first and second pipes have diameters of about ⅕λ or less.

16. The combination of claim 15, wherein the distance between the first and second pipes is on the order of about ⅕λ or less.

17. The thermal management system of claim 1, further comprising a heat sink which is equipped with a plurality of heat fins, wherein said acoustical resonator comprises an internal cavity which is in open communication with the external environment by way of a neck, and wherein said neck has said plurality of heat fins disposed therein.

18. The thermal management system of claim 17, wherein said neck has a maximum diameter $d_n$ taken along a plane perpendicular to its longitudinal axis, wherein said cavity has a maximum diameter $d_c$ taken along a plane perpendicular to its longitudinal axis, and wherein $d_c > d_n$.

19. The thermal management system of claim 5, wherein said first compartment is in open communication with a first pipe which extends in a first direction away from said first compartment, wherein said second compartment is in open communication with a second pipe which extends in a second direction away from said first compartment, and wherein said first and second directions are opposing directions.

20. The thermal management system of claim 19, wherein said first pipe has a first longitudinal axis, wherein said second pipe has a second longitudinal axis, and wherein said first and second longitudinal axes are parallel.

21. The thermal management system of claim 20, wherein said first and second longitudinal axes coincide.

22. The thermal management system of claim 19, further comprising a diaphragm which is open to both of said first and second compartments.

23. The thermal management system of claim 19, further comprising a diaphragm which forms a portion of the wall of said first and second compartments.

24. The thermal management system of claim 1, wherein said acoustical resonator comprises a cavity which is partitioned into first and second compartments, and wherein said first compartments is in open communication with said first pipe.

25. The thermal management system of claim 24, further comprising a second pipe, wherein said second compartments is in open communication with said second pipe.

* * * * *